United States Patent [19]
Nakamura et al.

[11] Patent Number: 5,725,975
[45] Date of Patent: Mar. 10, 1998

[54] GRADATION MASK AND PROCESS FOR PRODUCING THE SAME

[75] Inventors: Hiroyuki Nakamura; Naoya Hayashi, both of Tokyo, Japan

[73] Assignee: Dai Nippon Printing Co., Ltd., Japan

[21] Appl. No.: 675,372

[22] Filed: Jul. 2, 1996

Related U.S. Application Data

[63] Continuation of Ser. No. 282,539, Jul. 29, 1994, abandoned.

[30]    Foreign Application Priority Data

Aug. 6, 1993  [JP]  Japan ................... 5-195962
Aug. 6, 1993  [JP]  Japan ................... 5-195963

[51] Int. Cl.$^6$ ....................................... G03F 9/00
[52] U.S. Cl. ........................ 430/5; 430/7; 430/322
[58] Field of Search ..................... 430/57, 310, 312, 430/322, 13.14; 428/209, 469, 472

[56]    References Cited

U.S. PATENT DOCUMENTS

| | | |
|---|---|---|
| 5,095,379 | 3/1992 | Fukunaga et al. ............... 430/5 |
| 5,213,916 | 5/1993 | Cronin et al. .................. 430/5 |
| 5,225,035 | 7/1993 | Rolfson ....................... 156/643 |
| 5,286,581 | 2/1994 | Lee ............................ 430/5 |

Primary Examiner—S. Rosasco

[57]    ABSTRACT

A gradation mask having spatially stepped transmittance in at least three steps including substantially 0% and substantially 100%, the transmittance being regulated stepwise by varying the thickness of a homogeneous film of a chromium compound provided on a transparent substrate sheet. A process for producing a gradation mask having spatially stepped transmittance in at least three steps including substantially 0% and substantially 100%, including the steps of: forming on a transparent substrate sheet a homogeneous film of a chromium compound in a thickness enough to have a transmittance of at least 0%; removing the chromium compound film in predetermined areas by etching; and reducing the thickness of the remaining chromium compound film in predetermined areas by etching to such an extent that the transmittance is a predetermined intermediate value. A gradation mask having spatially stepped transmittance in at least three steps including substantially 0% and substantially 100%, wherein the area having a transmittance of at least substantially 0% has a predetermined transmittance other than 0% and 100% and includes a semitransparent film provided in a fine repeating pattern on a transparent substrate sheet. The semitransparent film in a fine repeating pattern is provided in such a manner that the phase difference is substantially the half-wavelength of a wavelength used or a value obtained by multiplying the half-wavelength by an odd number.

4 Claims, 6 Drawing Sheets

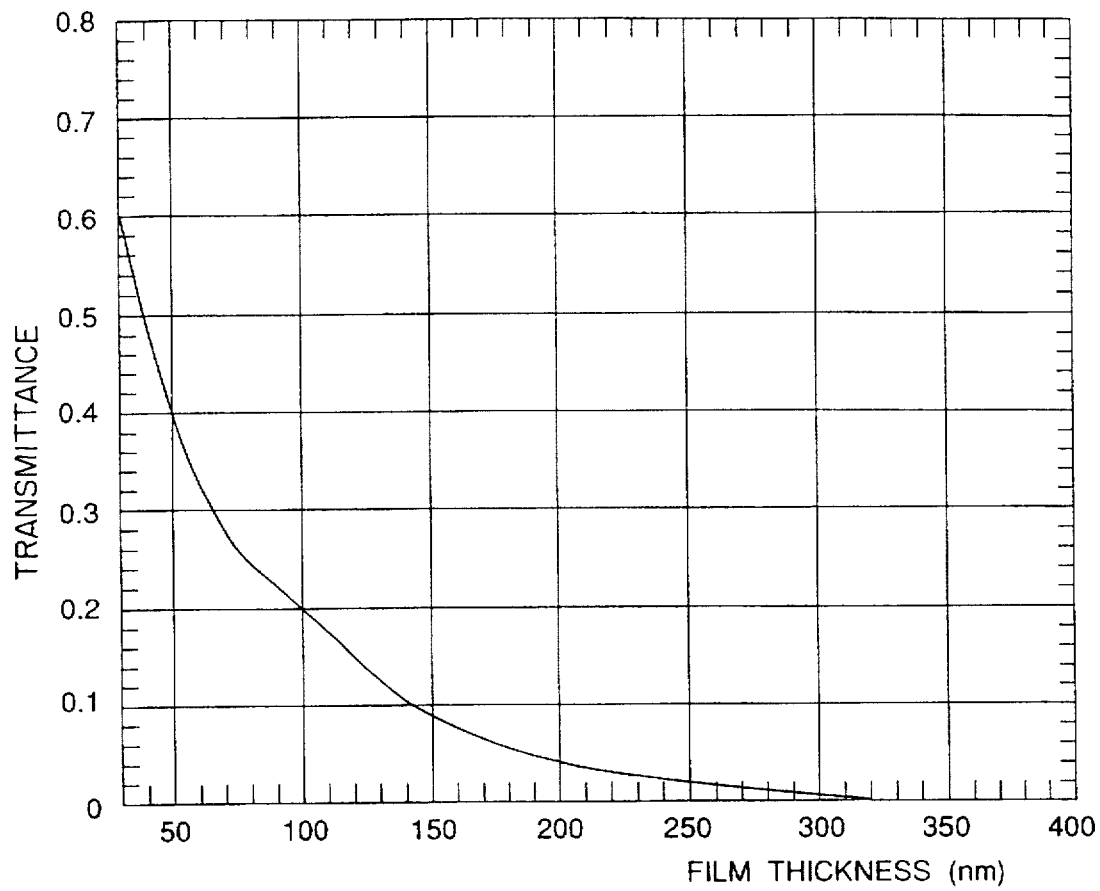
F I G. 3

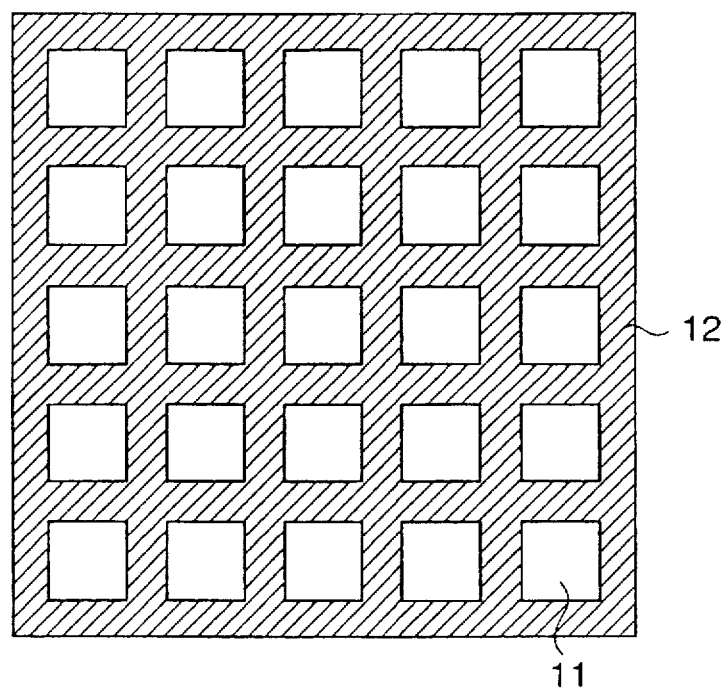
F I G. 6 A
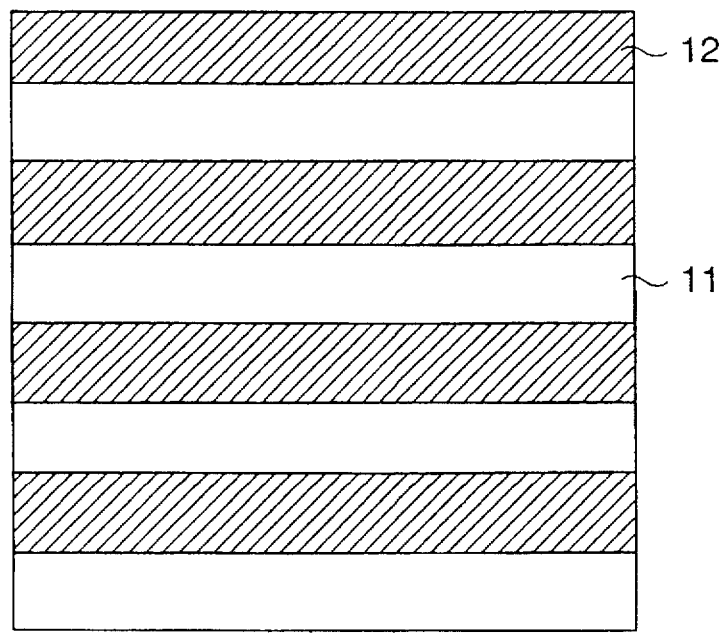
F I G. 6 B

GRADATION MASK AND PROCESS FOR PRODUCING THE SAME

This is a Continuation of application Ser. No. 08/282,539 filed Jul. 29, 1994, now abandoned.

BACKGROUND OF THE INVENTION

The present invention relates to a gradation mask having stepwise varied transmittances and a process for producing the same and particularly to a gradation mask for use in the production of a color filter and a process for producing the same.

In recent years, in the production of a color filter for color liquid crystal displays and the like, the use of a gradation mask having stepwise varied transmittances has been proposed to reduce the necessary number of times of exposure, thereby improving the yield (see Japanese Patent Laid-Open No. 5-11106).

This method will now be described with reference to a process diagram shown in FIG. 4. In the method shown in FIG. 4, a black matrix for preventing bleeding of color between colored pixels of a filter is previously provided on a substrate sheet. As shown in FIG. 4(a), a transparent conductive film 2 of ITO or the like is provided on the surface of a glass substrate sheet 1, a black matrix 3 is formed thereon by lithography or the like, and a photoresist film 4 is formed thereon. Subsequently, as shown in FIG. 4(b), a gradation mask 5 of which the transmittance varies according to the dimension and configuration of colored pixels of a color filter to be prepared is brought into close contact with or placed in close vicinity of the substrate sheet 1 in such a manner that it registers with the black matrix 3. Light 6 is homogeneously applied to the assembly through the gradation mask 5 to expose the photoresist film 4. In the gradation mask 5, for example, the transmittance of an area a corresponding to a red pixel of the color filter to be prepared is 0%, the transmittance of an area b corresponding to a green pixel is 10% and the transmittance of an area c corresponding to a blue pixel is 100%. In the homogeneous exposure through such a gradation mask 5, the resist in its area corresponding to the area a is not exposed at all, the resist in its area corresponding to the area b is somewhat exposed, and the resist in its area corresponding to the area c is sufficiently exposed. Thus, in the photoresist film 4, the exposure varies depending upon the positions of colored pixels. As shown in FIG. 4(c), for example, the development of the above photoresist film 4 with a developing solution having such a concentration as to remove only the resist in its area where the exposure is lowest causes only the resist in its area corresponding to the area a of the gradation mask 5 to be removed, so that the transparent conductive film 2 in its area corresponding to the removed resist area is exposed. In this state, as shown in FIG. 4(d), a voltage is applied to the transparent conductive film 2 to carry out electrophoresis which forms a red electrodeposited film R on the transparent conductive film 2 in its exposed area which corresponds to the opening of the resist. Then, as shown in FIG. 4(e), only the resist film 4 in its area corresponding to the area b of the gradation mask 5 is removed using a developing solution capable of removing only the area where the exposure is intermediate. Then, as shown in FIG. 4(f), a voltage is applied to the transparent conductive film 2 to carry out electrophoresis which forms a green electrodeposited film G on the transparent conductive film 2 in its exposed area which corresponds to the opening of the resist. In FIGS. 4(g) and (h), in the same manner as described above, a blue electrodeposited film B is formed on the transparent conductive film 2 in its area corresponding to the area c of the gradation mask 5, that is, areas where the black matrix 3 is absent. Thus, a color filter as shown in FIG. 4(h) is completed. In this connection, it is also possible to form a black matrix 3 in the same manner as described above so that the transmittance of the gradation mask is varied in four steps.

In the preparation of the above gradation mask having stepped transmittance including intermediate transmittance, the deposition of a particular metal, for example, by vacuum deposition has hitherto been used in the art. In some gradation masks for the production of a color filter, however, each area has a size of not more than about 50 µm, and it is not easy to prepare such a gradation mask having a small and accurate dimension with a high efficiency at a low cost.

Further, the conventional chromium film having a low transmittance has a problem that the film thickness is inherently so small that it is difficult to regulate the transmittance in gray tone (i.e., to regulate the thickness of chromium film) by etching.

SUMMARY OF THE INVENTION

In view of the above problems of the prior art, the present invention has been made, and an object of the present invention is to provide a gradation mask having stepped transmittance, which can be produced with high accuracy and efficiency at a low cost, and a process for producing the same.

In order to attain the above-described object, according to a first aspect of the present invention, there is provided a gradation mask having spatially stepped transmittance in at least three steps including substantially 0% and substantially 100%, said transmittance being regulated stepwise by varying the thickness of a homogeneous film of a chromium compound provided on a transparent substrate sheet.

In the gradation mask according to the first aspect of the present invention, the chromium compound is preferably at least one member selected from the group consisting of chromium oxide, chromium nitride, chromium oxide nitride and chromium oxide nitride carbide.

The above gradation mask is suitable for the production of a color filter comprising a plurality of colored pixels.

The above gradation mask of the present invention may be produced by a process for producing a gradation mask having spatially stepped transmittance in at least three steps including substantially 0% and substantially 100%, comprising the steps of: forming on a transparent substrate sheet a homogeneous film of a chromium compound in a thickness enough to have a transmittance of at least 0%; removing said chromium compound film in its predetermined areas by etching; and reducing the thickness of the remaining chromium compound film in its predetermined areas by etching to such an extent that the transmittance is a predetermined intermediate value.

In the above first aspect of the present invention, since the transmittance is regulated stepwise by varying the thickness of a homogeneous film of a chromium compound provided on a transparent substrate sheet, even when each transmittance area is fine, the gradation mask can be produced with high accuracy and efficiency at a low cost by taking advantage of lithography. This gradation mask is suitable particularly for the production of a color filter comprising a plurality of colored pixels.

According to the second aspect of the present invention, there is provided a gradation mask having spatially stepped transmittance in at least three steps including substantially 0% and substantially 100%, wherein the area having a transmittance of at least substantially 0% has a predetermined transmittance other than 0% and 100% and comprises a semitransparent film provided in a fine repeating pattern on a transparent substrate sheet, said semitransparent film in a fine repeating pattern being provided in such a manner that the phase difference is substantially the half-wavelength of a wavelength used or a value obtained by multiplying the half-wavelength by an odd number.

In the gradation mask according to the second aspect of the present invention, the repeating pitch of said fine repeating pattern is preferably not more than 3 μm, still preferably not more than 2 μm.

Further, in the gradation mask, the area having at least one transmittance between 0% and 100% both exclusive may comprise a single semitransparent film provided on the whole surface of said transparent substrate sheet.

The semitransparent film may comprise a chromium compound.

This gradation mask is suitable particularly for the production of a color filter comprising a plurality of colored pixels.

In the second aspect of the present invention, the area having a transmittance of at least substantially 0% has a predetermined transmittance other than 0% and 100% and comprises a semitransparent film provided in a fine repeating pattern on a transparent substrate sheet, the semitransparent film in a fine repeating pattern being provided in such a manner that the phase difference is substantially the half-wavelength of a wavelength used or a value obtained by multiplying the half-wavelength by an odd number. Therefore, even when each transmittance area is fine, the gradation mask can be produced with high accuracy and efficiency at a low cost simply by forming the above semitransparent film and patterning the semitransparent film by taking advantage of lithography or other techniques. This gradation mask is suitable particularly for the production of a color filter comprising a plurality of colored pixels.

BRIEF DESCRIPTION OF THE DRAWINGS

FIG. 3 is a diagram showing the relationship between the thickness of a chromium compound film and the transmittance;

FIGS. 6A and 6B are plan views of arrangement of a semitransparent film in an area having a transmittance of 0% according to other embodiments of the present invention.

BEST MODE FOR CARRYING OUT THE INVENTION

First Aspect of Invention

Figure 1A:
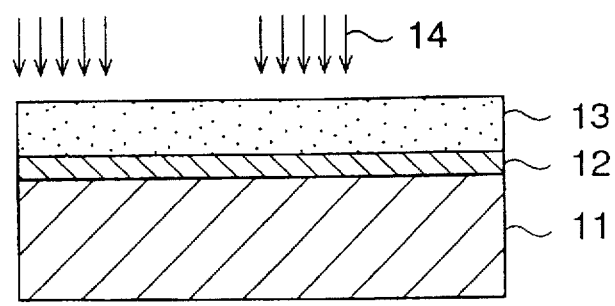
FIGS. 1A–1E are cross-sectional views showing the steps of producing a gradation mask according the first embodiment of the present invention.

The gradation mask according to the first aspect of the present invention and a process for producing the same will now be described with reference to the following embodiments.

The basic principle of the gradation mask according to the present invention is that a chromium compound capable of forming a semitransparent film, such as $CrO_x$, $CrN_x$, $CrO_xN_y$ or $CrO_xN_yC_z$, is used as a transmittance regulating film, and the film thickness is varied stepwise by utilizing lithographic techniques to vary the transmittance in a stepwise manner.

FIG. 1 is a diagram illustrating the steps of producing a gradation mask according to the first embodiment of the present invention. As shown in FIG. 1(a), a film 12 of a chromium compound of which the transmittance becomes 0% when the thickness is a given value or larger, such as $CrO_x$, $CrN_x$, $CrO_xN_y$ or $CrO_xN_yC_z$, is formed on a transparent substrate sheet 11 so that the transmittance is 0%. An electron beam resist or photoresist film 13 is formed thereon, and the resist 13 in its area corresponding to an area c (see FIG. 1(e)) of which the transmittance is to be 100% is subjected to exposure 14 with an electron beam, a laser beam or other light.

Figure 1B:
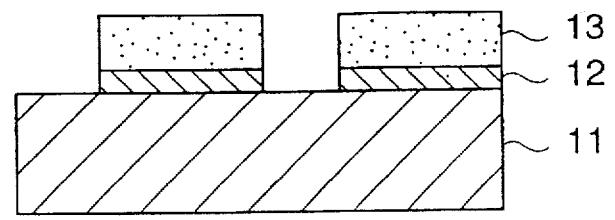

Then, as shown in FIG. 1(b), the resist 13 is developed to dissolve the exposed areas, and the chromium compound film 12 in its exposed areas is completely removed by dry etching or wet etching using the resist pattern as a mask.

Figure 1C:
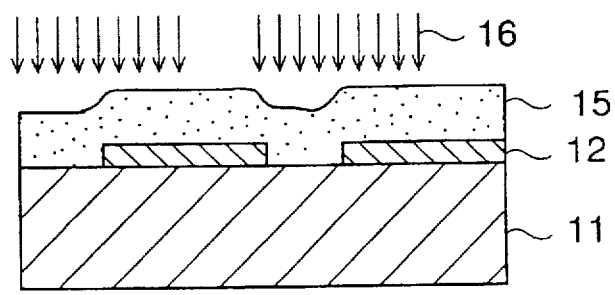

The resist remaining unremoved is peeled off, and as shown in FIG. 1(c), a fresh electron beam resist or photoresist film 15 is then formed again. Thereafter, the resist 15 in its areas respectively corresponding to an area c of which the transmittance is to be 100% and an area b (see FIG. 1(e)) of which the transmittance is to be intermediate is subjected to exposure 16 with an electron beam, a laser beam or other light. In this case, only the resist in its area corresponding to the area b of which the transmittance is to be intermediate may be exposed.

Figure 1D:
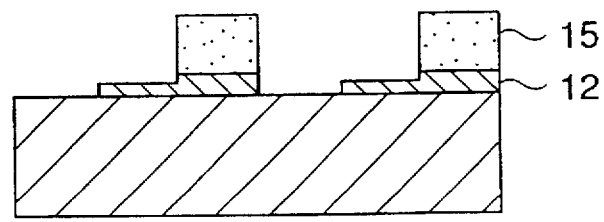

Then, as shown in FIG. 1(d), the resist 15 is developed to dissolve the exposed areas, and the chromium compound film 12 in its exposed area is subjected to dry etching or wet etching by using the resist pattern as a mask to an intermediate thickness without completely removing the exposed area.

Figure 1E:
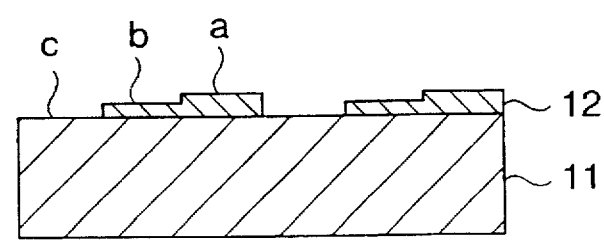

Finally, the remaining resist is peeled off. Thus, a gradation mask as shown in FIG. 1(e) is completed. The area c which has been firstly etched has a transmittance of 100% because no chromium film 12 is left. The area b which has been next etched is semitransparent and has a transmittance of, for example, 10% because the thickness of the chromium compound film 12 is intermediate. The area a which has not been etched is impermeable to light and has a transmittance of 0% because the chromium compound film 12 completely remains unremoved.

Thus, it is possible to produce a gradation mask having spatially stepped transmittance in three steps of 100%, an intermediate desired transmittance and 0%. It is also possible to produce a gradation mask having spatially stepped transmittance in which the intermediate transmittance is varied in at least two steps by further repeating at least once the steps of formation of a resist, pattering and etching.

FIG. 2 is a diagram showing the steps of producing a gradation mask according to the second embodiment of the present invention. As shown in FIG. 2(a), a film 12 of a chromium compound of which the transmittance becomes 0% when the thickness is a given value or larger, such as $CrO_x$, $CrN_x$, $CrO_xN_y$ or $CrO_xN_yC_z$, is formed on a transparent substrate sheet 11 so that the transmittance is 0%. A film of an electron beam resist or photoresist 13 is formed thereon, and the resist 13 in its area corresponding to an area c of which the transmittance is to be 100% and an area b of which the transmittance is to be intermediate (see FIG. 2(e)) are subjected to exposure 17 with an electron beam, a laser beam or other light. In this case, a light beam 18 at a higher exposure and a light beam 19 at a lower exposure are simultaneously applied respectively to the area c and the area b.

Figure 2A:
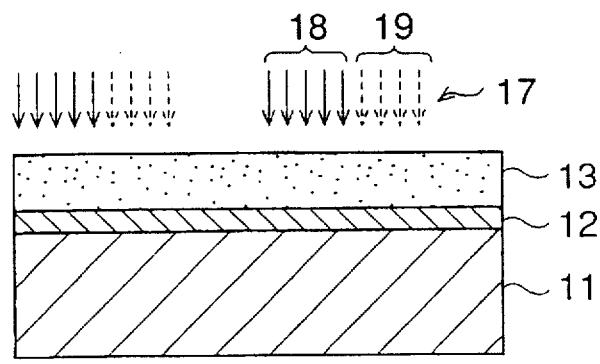
FIGS. 2A–2E are cross-sectional views showing the steps of producing a gradation mask according to the second embodiment of the present invention.
Figure 2B:
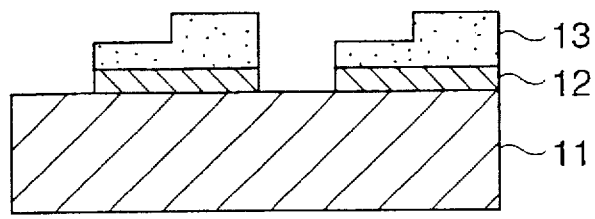

Then, as shown in FIG. 2(b), development is carried out by using a developing solution capable of completely removing the resist 13 in its areas exposed at a higher exposure or by selecting a developing time enough to completely remove the resist 13 in its areas exposed at a higher exposure, thereby completely removing only the resist 13 in its area corresponding to the area c, and the chromium compound film 12 in its exposed areas is completely removed by dry etching or wet etching using the resist pattern as a mask.

Figure 2C:
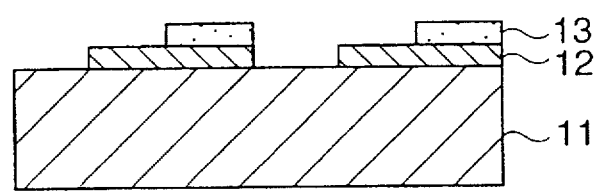

Thereafter, as shown in FIG. 2(c), the resist 13 in its areas exposed at a lower exposure is completely removed by carrying out development using a developing solution capable of completely removing the resist 13 in its areas exposed at a lower exposure or by further continuing the developing.

Figure 2D:
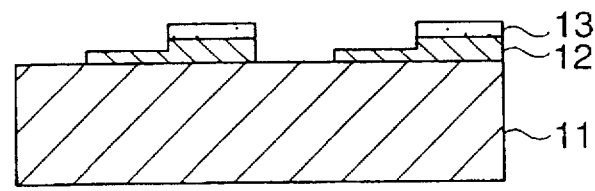

Then, as shown in FIG. 2(d), the chromium compound film 12 in its newly exposed areas is subjected to dry etching or wet etching by using the remaining resist pattern as a mask to an intermediate thickness without completely removing the exposed areas.

Figure 2E:
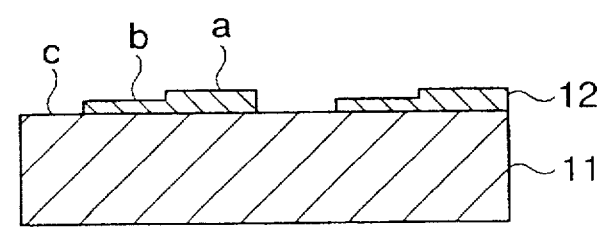
Figure 4A:
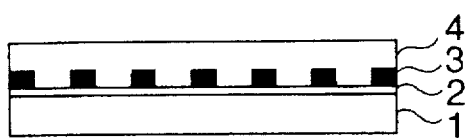
FIGS. 4A–4H are schematic cross-sectional views showing the steps of a process for producing a color filter using a gradation mask.
Figure 4B:
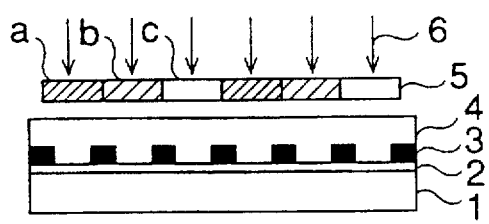
Figure 4C:
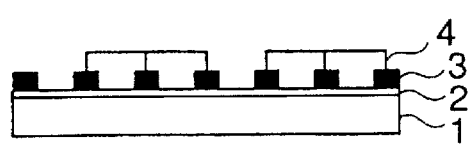
Figure 4D:
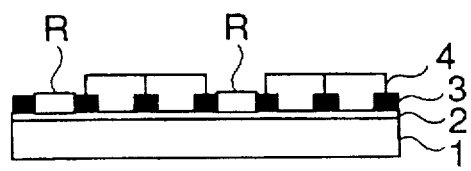
Figure 4E:
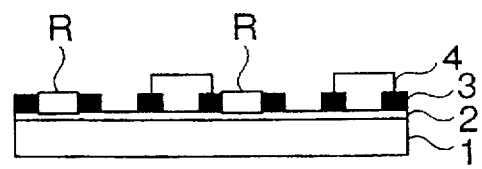
Figure 4F:
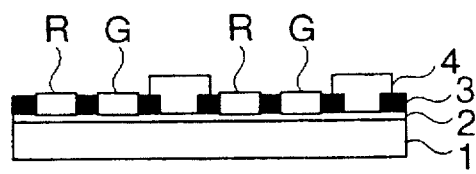
Figure 4G:
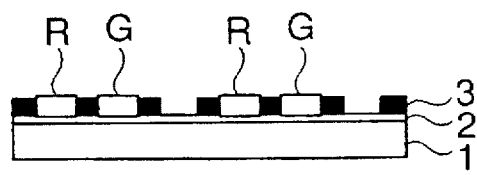
Figure 4H:
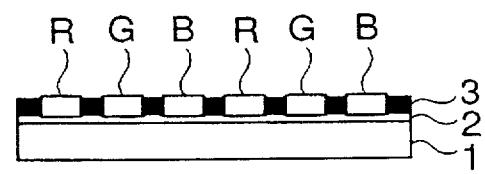

Finally, the remaining resist is peeled off. Thus, a gradation mask as shown in FIG. 2(e) is completed. The area c which has been firstly etched has a transmittance of 100% because no chromium compound film 12 is left. The area b which has been next etched is semitransparent and has a transmittance of, for example, 10% because the thickness of the chromium compound film 12 is intermediate. The area a which has not been etched at all is impermeable to light and has a transmittance of 0% because the whole chromium compound film 12 remains unremoved.

Thus, it is possible to produce a gradation mask having spatially stepped transmittance in three steps of 100%, an intermediate desired transmittance and 0%. In this embodiment, it is also possible to produce a gradation mask having spatially stepped transmittance in which the intermediate transmittance is varied in at least two steps by increasing the exposure distribution in at least three steps and correspondingly repeating the steps of formation of a resist, pattering and etching.

According to the process of the present invention, since each transmittance area of the gradation mask is formed by patterning and etching using a lithography process, even when the dimension of each area corresponding to colored pixels of a color filter for liquid crystal displays is very small, a gradation mask for use in the production of a color filter as shown in FIG. 4 can be produced with high accuracy and efficiency at a low cost.

An embodiment of a process for producing the gradation mask according to the first aspect of the present invention will now be described.

A chromium compound film was formed on a high-purity synthetic quartz by sputtering under the following conditions, and the relationship between the film thickness and the transmittance was examined. The relationship between the film thickness and the transmittance for an i-line wavelength (365 nm) of a mercury lamp was as shown in FIG. 3.

Film forming device: planer type DC magnetron sputter

Target: metallic chromium Gas and flow rate: carbon dioxide gas 70 sccm+nitrogen gas 30 sccm Sputter pressure: 3 mmTorr Sputter current: 6 A Then, the composition ratio of chromium, oxygen, nitrogen and carbon in the chromium compound film was determined by X-ray photoelectric spectrophotometry (XPS). As a result, the ratio of the number of atoms of chromium to oxygen to nitrogen to carbon was 1:2.5: 0.1:0.4.

Based on the above results, a chromium compound film having a thickness of 400 nm was formed on a high-purity synthetic quartz under the above conditions. Then, the chromium compound film in its area corresponding to the area c in FIG. 1(e) was entirely etched, and the chromium compound film in its area corresponding to the area b was subjected to reactive ion etching (RIE) to a film thickness of 140 nm.

Pressure: 0.33 Torr (44 Pa)

Gas and flow rate: $CH_2Cl_2$ gas 44 sccm+oxygen gas 44 sccm

RF output: 240 W

Etching rate: 28.7 nm/min

As a result, in the gradation mask thus formed, the transmittance of a light having a wavelength of 365 nm was 100% for the area c where the chromium compound film had been removed, about 10% for the area b where the chromium compound film was etched to a thickness of 140 nm and 0% for the area where the chromium compound film was not etched at all. Thus, an intended gradation mask was provided.

Regarding the composition ratio of $CrO_xN_yC_z$, the above values are a mere embodiment, and the composition ratio range, which may be used with satisfactory results, is x=1 to 3, y=0.05 to 2.5 and z=0.005 or more. Further, it is also possible to use other chromium compounds, such as $CrO_x$, $CrN_x$, $CrO_xN_y$ and $CrCl_x$, instead of $CrO_xN_yC_z$. Furthermore, a compound of which the transmittance becomes 0% in a given film thickness or more may be used instead of the chromium compound. Furthermore, the lithographic process for etching the chromium compound is not limited to one shown in FIG. 1 and may be varied and modified. Furthermore, the gradation mask according to the present invention can be used not only for the production of a color filter shown in FIG. 4 but also for other applications.

As is apparent from the foregoing description, according to the gradation mask and the process for producing the same according to the present invention, the regulation of the stepped transmittance of the gradation mask is carried out by varying the thickness of a homogeneous chromium compound film provided on a transparent substrate sheet. Therefore, even when each transmittance area is fine, the gradation mask can be produced with high accuracy and efficiency at a low cost by taking advantage of lithography. Such a gradation mask is suitable particularly for the production of a color filter comprising a plurality of colored pixels.

Second Aspect of Invention

The gradation mask according to the second aspect of the present invention will now be described with reference to the following embodiments.

The basic principle of the gradation mask according to the second aspect of the present invention is that in the construction of a gradation mask having spatially stepped transmittance, a film which is semitransparent and can serve to shift the phase of light is used to form an area having a transmittance of substantially 0% and an area having an intermediate transmittance. Materials for the semitransparent film capable of serving to shift the phase of light include, for example, chromium compounds, such as $CrO_x$, $CrN_x$, $CrO_xN_y$ or $CrO_xN_yC_z$.

Figure 5A:
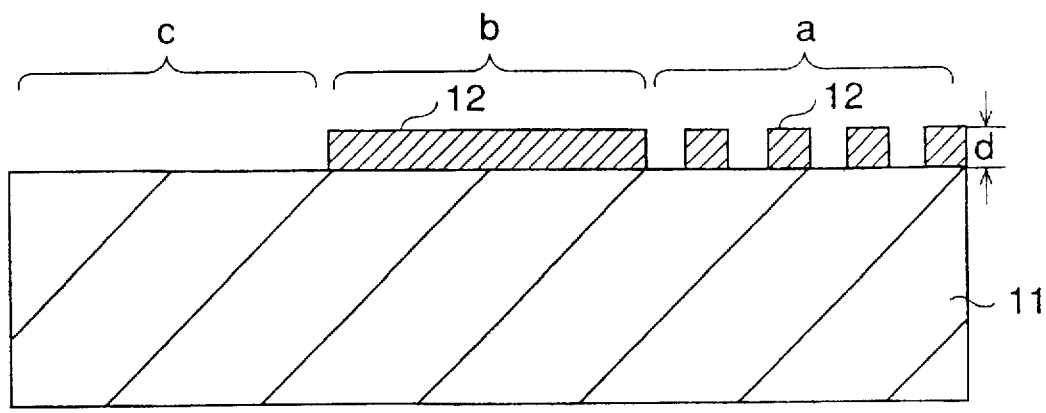
FIG. 5A is a cross-sectional view of a gradation mask according to an embodiment in the second aspect of the present invention.
Figure 5B:
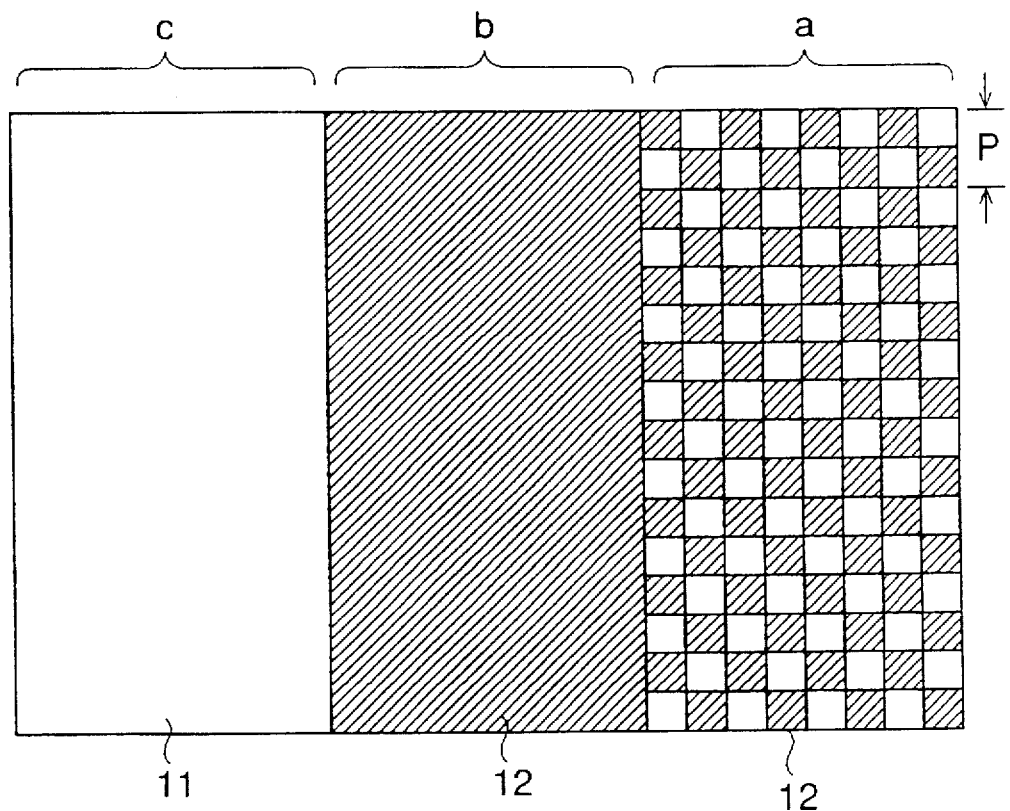
FIG. 5B is a plan view of a gradation mask according to an embodiment in the second aspect of the present invention.

FIG. 5A is a cross-sectional view of a gradation mask according to an embodiment in the second aspect of the present invention, and FIG. 5B is a plan view of the gradation mask shown in FIG. 5A. A semitransparent film 12 is provided on the whole surface of a transparent substrate sheet 11 in its area b, while the semitransparent film 12 is not provided at all in an area c. In an area a, the transparent film 12 is provided, for example, in a checkerwise pattern with the repeating pitch being p.

The semitransparent film 12 comprises a semitransparent material having a refractive index n in a thickness d and a wavelength λ used, and the film thickness d and the refractive index n are provided so as to satisfy a requirement represented by the following formula (1) wherein N is 1 or an odd number:

$$(\pi - \pi/3) \times N \leq 2\pi \cdot d(n-1)/\lambda \leq (\pi + \pi/3) \times N \quad (1)$$

That is, they are provided in such a manner that the phase difference between the area provided with the semitransparent film 12 and the area not provided with the semitransparent film 12 is the half-wavelength of a wavelength used or a value obtained by multiplying the half-wavelength by an odd number.

Further, the transmittance of the semitransparent film 12 is set to a value between 0% and 100% both exclusive, for example, 10%, in the thickness d.

Thus, in the semitransparent film 12, the phase difference is substantially 180° or a value obtained by multiplying it by an odd number with the transmittance being a predetermined value. For example, in the case of chromium compounds, such as $CrO_x$, $CrN_x$, $CrO_xN_y$ or $CrO_xN_yC_z$, both the requirements can be simultaneously satisfied by varying the composition, texture and structure of the material constituting the film 12.

The repeating pitch p at which the semitransparent film 12 is provided in the area a is set to not more than 2 μm.

In the gradation mask having the above construction according to the present invention, the transmittance of the area b is between 0% and 100% both exclusive, for example, 10%, because the semitransparent film 12 is provided on the whole surface of the area b, while the transmittance of the area c is substantially 100% because the semitransparent film 12 is not provided at all. On the other hand, the transmittance of the area a is substantially 0% because the semitransparent film 12 in a checkerwise pattern is provided at a repeating pitch p of not more than 2 μm.

The reason why the transmittance of the area a is substantially 0% is as follows. Since the phase difference between the light passed through the position where the semitransparent film 12 has been provided and the light passed through the position where no semitransparent film 12 has been provided is substantially 180° or a value obtained by multiplying it by an odd number, the lights which have been passed through respective areas and diffracted at edges overlap with each other in the projected plane or the image surface and mutually negate due to interference. The above phenomenon occurs when the repeating pitch p is substantially not more than 2 μm.

The configuration of the semitransparent film 12 in the area a is not limited to the checkerwise pattern as shown in FIG. 5 and may be repeated patterns as shown in FIGS. 6A and 6B.

As described above, an area a having a transmittance of substantially 0% can be formed by periodically providing the semitransparent film 12 at the repeating pitch p. It is also possible to form an area having a transmittance between 0% and 100% both exclusive, for example, 80%, by varying the area ratio of the portion provided with the semitransparent film 12 to the portion not provided with the semitransparent film in such a manner that the amplitude of the lights which interfere with each other at a phase difference of 180° becomes a value other than 1. Therefore, it is possible to provide a gradation mask with the transmittance being varied in at least four steps including substantially 0% and substantially 100%.

In the production of such a gradation mask, lithography can be utilized. An embodiment thereof will now be described. A material which can have a film thickness d satisfying the formula (1) and a desired transmittance, for example, a chromium compound, such as $CrO_x$, $CrN_x$, $CrO_xN_y$ or $CrO_xN_yC_z$, is selected. The film having a thickness d is formed on a transparent substrate sheet 11. An electron beam resist or photoresist film is formed thereon. The resist film in its area corresponding to the area c of which the transmittance is to be 100% and its area corresponding to the area a of which the transmittance is to be 0% is subjected to exposure in a predetermined pattern with an electron beam, a laser beam or other light. The resist film is then developed to dissolve the exposed areas. The chromium compound film in its exposed areas is completely removed by dry etching or wet etching using the resist pattern as a mask. Then, the remaining resist is peeled off. Thus, a gradation mask as shown in FIG. 5 can be prepared.

According to the above-described production process using a lithographic technique, each transmittance area of the gradation mask is prepared by patterning and etching using the lithographic technique. Therefore, even when the dimension of each area corresponding to colored pixels of a color filter for liquid crystal displays is very small, a gradation mask for use in the production of a color filter as shown in FIG. 4 can be produced with high accuracy and efficiency at a low cost.

Although the gradation mask of the present invention has been described with reference to embodiments, it is to be understood that variations and modifications may be employed without departing from the spirit and scope of the invention. Further, the gradation mask of the present invention may be used not only for the production of a color filter as shown in FIG. 4 but also for other applications.

As is apparent from the foregoing description, in the gradation mask according to the second aspect of the present invention, the area having a transmittance of at least substantially 0% has a predetermined transmittance other than 0% and 100% and comprises a semitransparent film provided in a fine repeating pattern on a transparent substrate sheet, the semitransparent film in a fine repeating pattern being provided in such a manner that the phase difference is substantially the half-wavelength of a wavelength used or a value obtained by multiplying the half-wavelength by an odd number. Therefore, even when each transmittance area is fine, the gradation mask can be produced with high accuracy and efficiency at a low cost simply by forming the above semitransparent film and patterning the semitransparent film by taking advantage of lithography or other techniques. This gradation mask is suitable particularly for the production of a color filter comprising a plurality of colored pixels.

We claim:

1. A gradation mask for forming a color filter having a plurality of colored pixels, said gradation mask having spatially stepped transmittance in at least three steps including a first step having substantially 0% transmittance, a second step having substantially 100% transmittance, and at least one additional step having a transmittance between 0% and 100%, said mask comprising:

a transparent substrate sheet; and a film of a chromium compound formed on said transparent substrate sheet, said chromium compound film having at least two regions of varying thickness to provide, respectively, said first step having substantially 0% transmittance and said at least one additional step having a transmittance between 0% and 100%, wherein at least one of said at least one additional step is positioned on said transparent substrate sheet adjacent said first and/or second steps.

2. A process for producing a gradation mask for forming a color filter having a plurality of colored pixels, said gradation mask having spatially stepped transmittance in at least three steps including substantially 0% and substantially 100%, comprising the steps of:

forming on a transparent substrate sheet a homogeneous film of a chromium compound to a thickness large enough to have a transmittance of 0%;

removing a first portion of said homogeneous film in first predetermined areas by etching; and reducing the thickness of a portion of the remaining homogeneous film in second predetermined areas by etching to such an extent that the transmittance of said second predetermined areas is a predetermined intermediate value between 0% and 100%.

3. A gradation mask for forming a color filter having a plurality of colored pixels, said gradation mask having spatially stepped transmittance in at least three steps including a first step having substantially 0% transmittance, a second step having substantially 100% transmittance, and at least one additional step having a transmittance between 0% and 100%, comprising:

a transparent substrate sheet; and a semitransparent film formed on said transparent substrate sheet, said semitransparent film having (i) a first area defining said first step having substantially 0% transmittance, said first area being arranged in a fine repeating pattern on said transparent substrate sheet, said fine repeating pattern being provided in such a manner that the phase difference is substantially the half-wavelength of a wavelength of light used with said mask or a value obtained by multiplying the half-wavelength by an odd number, and (ii) at least one second area defining said at least one additional step having a transmittance between 0% and 100%.

4. A process for producing a gradation mask for forming a color filter having a plurality of colored pixels, said gradation mask having spatially stepped transmittance in at least three steps including substantially 0% and substantially 100%, comprising the steps of:

forming on a transparent substrate sheet a homogeneous film of a chromium compound to a thickness large enough to have a transmittance of 0%;

removing a first portion of said homogeneous film in first predetermined areas by etching to form said step having substantially 100% transmittance; and removing select areas of a portion of the remaining homogeneous film in second predetermined areas by etching to form a fine repeating pattern such that the transmittance of said second predetermined areas as a whole is substantially 0%, and the transmittance of the remaining homogeneous film is a predetermined intermediate value between 0% and 100%.

* * * * *